US006954169B1

(12) United States Patent
Min

(10) Patent No.: US 6,954,169 B1
(45) Date of Patent: Oct. 11, 2005

(54) 1/F NOISE, OFFSET-VOLTAGE CHARGE INJECTION INDUCED ERROR CANCELLED OP-AMP SHARING TECHNIQUE

(75) Inventor: Byung-Moo Min, Lexington, MA (US)

(73) Assignee: National Semiconductor Corporation, Santa Clara, CA (US)

( * ) Notice: Subject to any disclaimer, the term of this patent is extended or adjusted under 35 U.S.C. 154(b) by 257 days.

(21) Appl. No.: 10/269,931

(22) Filed: Oct. 11, 2002

(51) Int. Cl.[7] .............................................. H03M 1/12
(52) U.S. Cl. ....................... 341/172; 341/161; 341/151
(58) Field of Search ................................ 341/172, 155, 341/161, 151, 156, 120

(56) References Cited

U.S. PATENT DOCUMENTS

| | | | | |
|---|---|---|---|---|
| 6,323,800 B1 | * | 11/2001 | Chiang | 341/155 |
| 6,337,651 B1 | * | 1/2002 | Chiang | 341/161 |
| 6,420,991 B1 | * | 7/2002 | Yu | 341/172 |
| 6,486,820 B1 | * | 11/2002 | Allworth et al. | 341/155 |
| 6,577,185 B1 | * | 6/2003 | Chandler et al. | 341/155 |
| 6,600,440 B1 | * | 7/2003 | Sakurai | 341/172 |
| 6,617,992 B2 | * | 9/2003 | Sakurai | 341/172 |

OTHER PUBLICATIONS

K. Nagaraj et al., "A 25–mW, 52–Msamples/s Parallel–Pipelined A/D Converter with Reduced Number of Amplifiers", IEEE Journal of Solid State Circuits, vol. 32, No. 3, Mar. 1997, pp. 312–320.

* cited by examiner

*Primary Examiner*—Lam T. Mai
(74) *Attorney, Agent, or Firm*—Merchant & Gould P.C.; Timothy P. Sullivan

(57) ABSTRACT

The present invention provides an apparatus and method for reducing and canceling 1/f noise, offset voltage, and charge injection introduced in pipeline ADCs in conventional op-amp sharing techniques. The polarity of the residue signals is changed at each phase. During phase one, the residue signal of the operational amplifier is sampled on the capacitors with inverse polarity. During phase 2 the residue signal of the operational amplifier is sampled on the capacitors with the inverse polarity of phase one.

22 Claims, 3 Drawing Sheets

PHASE 1

PHASE 2

1/F NOISE, OFFSET-VOLTAGE CHARGE INJECTION INDUCED ERROR CANCELLED OP-AMP SHARING TECHNIQUE

FIELD OF THE INVENTION

The present invention is related to electronic circuits, and more specifically to switched-capacitor circuits.

BACKGROUND OF THE INVENTION

A/D conversion is important in a wide variety of applications. Many different circuits may be used to convert analog signals to digital signals. These ADC circuits have many drawbacks.

For example, in pipelined A/D circuits (ADC) that share operational amplifiers (op-amps) between stages, errors may be introduced. More specifically, a charge injection error voltage at the op-amp input node may be introduced. This causes a large offset voltage as the charge injection error voltage is added with the intrinsic offset voltage of op amp. The large offset voltage may affect the precision of the ADC.

Also, as the process technology is scaled down, Fliker (1/f) noise becomes more critical as the corner frequency tends to increase.

SUMMARY OF THE INVENTION

Briefly described, the present invention is directed at providing an apparatus and method for reducing and canceling 1/f noise, offset voltage, and charge injection introduced in pipeline ADCs employing conventional op-amp sharing techniques.

According to one aspect of the invention, the polarity of the residue signals is changed at each phase. During phase one, the residue signal of the operational amplifier is sampled on the capacitors with inverse polarity. During phase two, the residue signal of the operational amplifier is sampled on the capacitors with the inverse polarity of phase one.

According to another aspect of the invention, an apparatus is provided for reducing and canceling 1/f noise, offset voltage, and charge injection introduced in pipeline ADCs employing conventional op-amp sharing techniques by reversing polarity at each phase.

According to yet another aspect of the invention, a method is provided for reducing and canceling 1/f noise, offset voltage, and charge injection introduced in pipeline ADCs employing conventional op-amp sharing techniques by reversing polarity at each phase.

DETAILED DESCRIPTION OF THE PREFERRED EMBODIMENT

Figure 1:
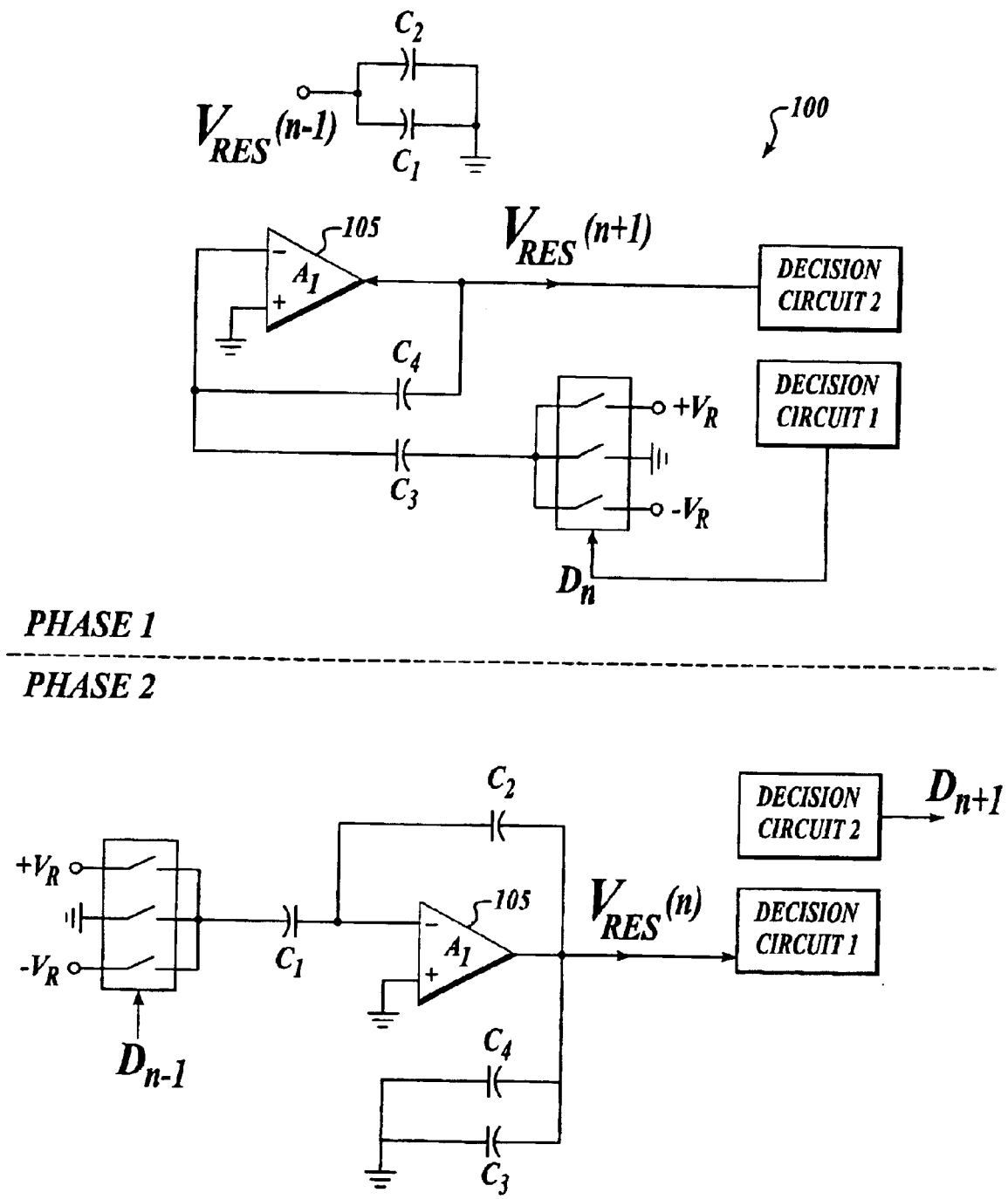
FIG. 1 illustrates the basic operation principle of a shared op-amp pipeline ADC.

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected or an indirect connection through one or more passive or active intermediary devices. The term "circuit" means either a single component or a multiplicity of components, either active and/or passive, that are coupled together to provide a desired function. The term "signal" means at least one current, voltage, or data signal. Referring to the drawings, like numbers indicate like parts throughout the views.

Switched-capacitor pipeline ADCs use an op amp during the amplification/integration phase and not during the input sampling phase. The number of op-amps in a pipeline ADC can be reduced by sharing them between stages in the pipeline. An amplifier is shared between two different switched capacitor networks that are working on opposite clock phases.

Briefly described, the present invention is directed at providing an apparatus and method for reducing and canceling 1/f noise, offset voltage, and charge injection introduced in pipeline ADCs employing conventional op-amp sharing techniques.

FIG. 1 illustrates the basic operation principle of a shared op-amp pipeline ADC. Capacitors C1 and C2 are part of the nth stage. Capacitors C3 and C4 are part of the (n+1)th stage. Operational amplifier 105 alternates between the two switched-capacitor networks on opposite clock phases. The operation of circuit 100 will now be described.

During phase 1, capacitors C1 and C2 sample VRES(n−1). VRES(n−1) is the residue signal of the previous stage. During phase 2, capacitors C1 and C2, op-amp 105 develop VRES(n) under the control of signal D(n−1). The residue is sampled by capacitors C3 and C4 and is processed by decision circuit 1.

During phase 1 of the next clock interval, capacitors C3, C4, and op-amp 105 develop VRES(n+1). This residue is sampled by decision circuit 2.

The additional switches that are used to implement the op-amp sharing technique introduce series resistances and give charge injection error voltage at the op-amp input node. This charge injection error voltage at the op amp input node can cause a large offset voltage. This large offset voltage results because the error voltage is added with the intrinsic offset voltage of the op amp. This offset voltage should be cancelled for higher precision ADCs.

Also, as the process technology is scaled down, Fliker (1/f) noise becomes more critical as the corner frequency tends to increase.

The error (Verror) is added to the output of the op-amp at each stage. This error is added to the residue signal of the stages in the pipeline. In a 1.5 bit pipeline stage, this may be expressed as:

$$Vres(1,k)=2*Vin(k)-D1(k)*Vref+Verror(1,k)$$

$$Vres(2,k)=2*Vres(1,k)-D2(k)*Vref+Verror(2,k)=4*Vin(k)-2*D1(k)*Vref-D2(k)*Vref+2*Verror(1,k)+Verror(2,k)$$

Figure 2:
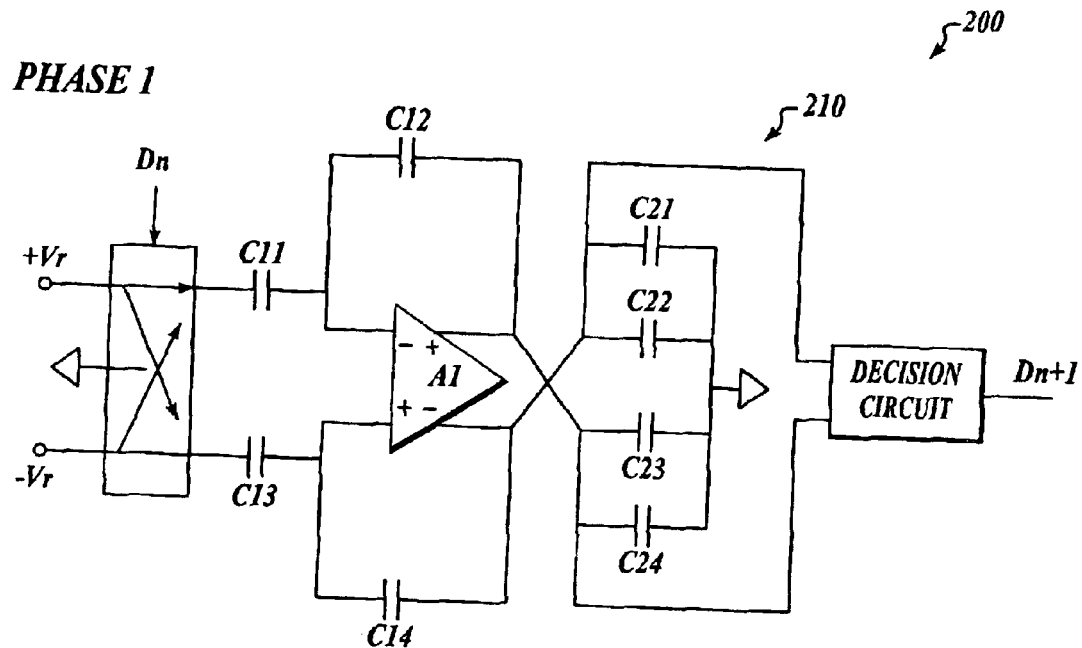
FIG. 2 illustrates a schematic diagram of a circuit to cancel 1/f noise, offset voltage, and charge injection introduced in pipeline ADCs utilizing an op-amp sharing technique.
Figure 2:
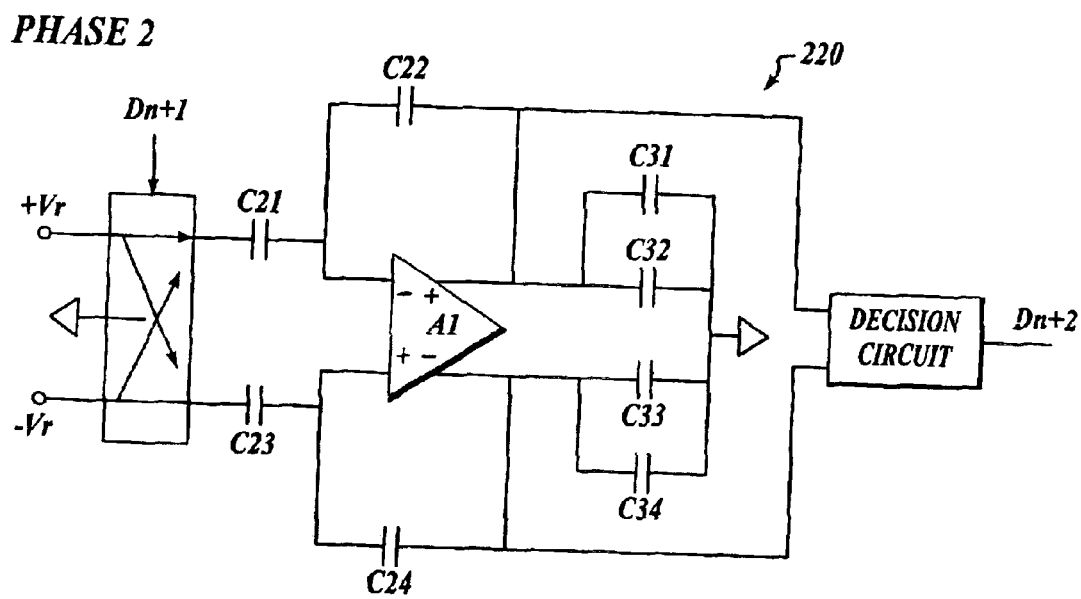

FIG. 2 illustrates a schematic diagram of a circuit to cancel 1/f noise, offset voltage, and charge injection introduced in pipeline ADCs utilizing an op-amp sharing technique, in accordance with aspects of the invention. As shown in the figure, canceling circuit 200 includes capacitors, C11, C12, C13, C14, C21, C22, C23, C24, C31, C32, C33 and C34, amplifier A1 and a decision circuit.

Phase 1 of canceling circuit 200 is illustrated in block 210. Phase 2 of the canceling circuit is illustrated in block 220. The operation of circuit 200 will now be described.

During phase 1, the first residue signal of op-amp A1 is sampled with inverse polarity on capacitors, C21, C22, C23, and C24. Capacitors C21 and C22 sample the negative output of op-amp A1, and capacitors C23 and C24 sample the positive output of op-amp A1. During phase 1 operation of the exemplary canceling circuit, the input of the decision circuit has been reversed to ensure the correct decision is made relating to the analog residue signal.

During phase 2, capacitor C21 and capacitor C22 are in the positive feedback path of op-amp A1, and capacitor C23 and capacitor C24 are in the negative feedback path. The polarity of the error voltage, which has 1/f noise, offset voltage, and charge injection induced errors, has been inversed and added with the error voltage of second residue signal during phase 2.

When this technique is applied to a closed loop gain stage, with gain equal to 1, the error voltage can be totally cancelled. When this technique is applied to a closed loop gain stage, with gain equal to 2, the error voltage can be reduced to one-third of the error of the conventional architecture. This will now be described in more detail.

The error voltage discussed with regard to FIG. 1 is composed of low frequency components as compared with the clock frequency. For purposes of this discussion, it is assumed that the error voltage has same value between the two phases.

Therefore, the overall error voltage may be canceled if the polarity of the first residue signal is reversed during the second phase at each op-amp sharing stage. This results because the error voltage at the first phase is subtracted from the error voltage at the second stage.

When the polarity of the first residue signal is reversed, the residue signal of second phase is changed as follows:

$$Vres(2,k)=-4*Vin(k)+2*D1(k)*Vref-D2(k)*Vref-2*Verror(1,k)+Verror(2,k)$$

Also, as the error voltages have similar value between phases:

$$Verror(1,k)=Verror(2,k)$$

$$Vres(2,k)=-4*Vin(k)+2*D1(k)*Vref-D2(k)*Vref-Verror(1,k)$$

In contrast, however, the residue signal of the conventional architecture sharing op-amps is:

$$Vres(2,k)=-4*Vin(k)+2*D1(k)*Vref-D2(k)*Vref+3*Verror(1,k)$$

It can be seen from the discussion, therefore, that by reversing the polarity at each stage, the error voltage of the given op-amp sharing stage has been reduced to one third (⅓) of that of the conventional architecture.

Figure 3:
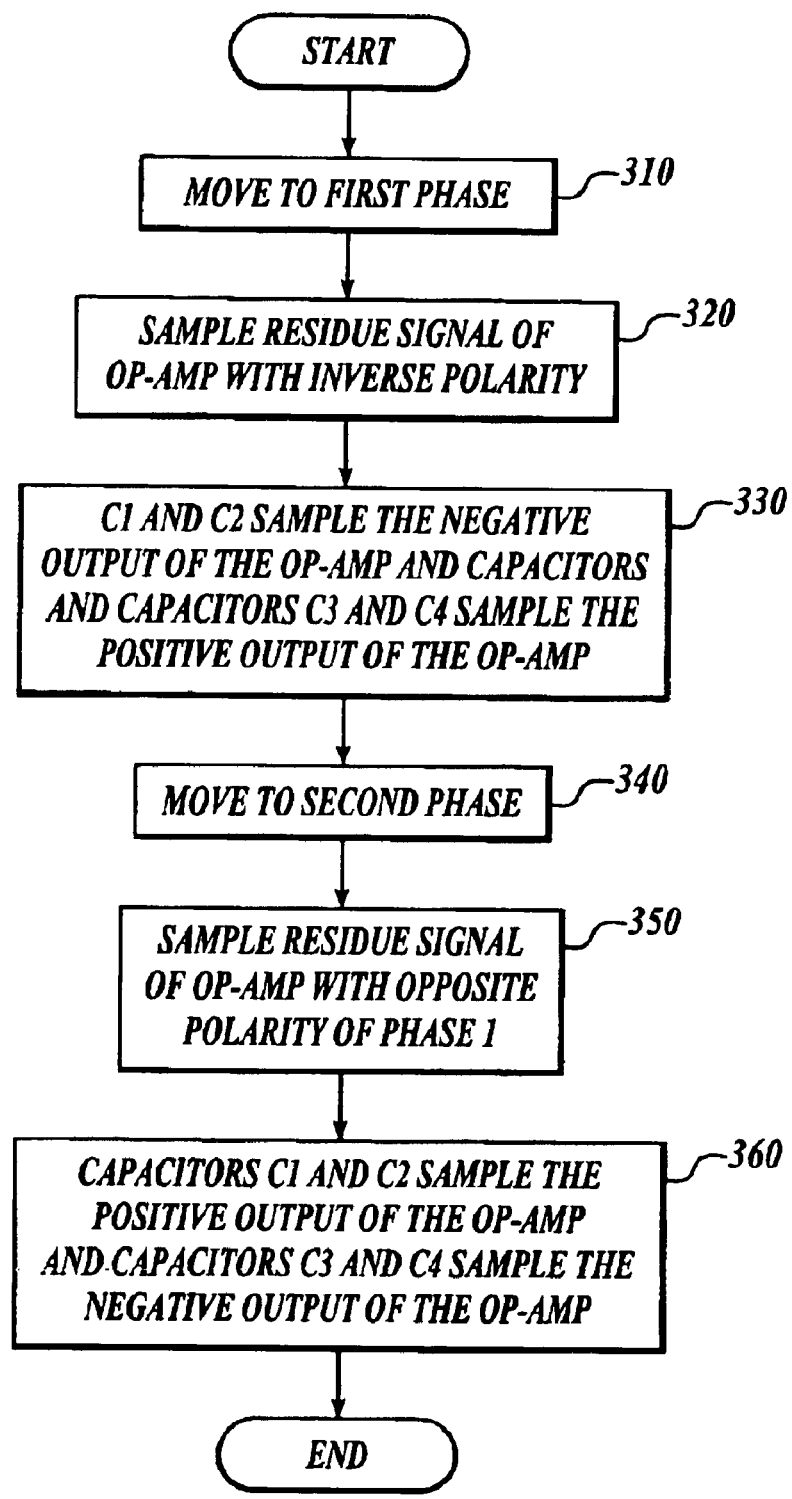
FIG. 3 illustrates a process for canceling 1/f noise, offset voltage, and charge injection induced introduced in pipeline ADCs utilizing an op-amp sharing technique, in accordance with aspects of the invention.

FIG. 3 illustrates a process for canceling 1/f noise, offset voltage, and charge injection introduced in pipeline ADCs utilizing an op-amp sharing technique, in accordance with aspects of the invention.

After a start block, the process moves to the first phase of an AD pipeline (block 310). Moving to block 320, the residue signal of the shared op-amp is sampled with inverse polarity. Transitioning to block 330, capacitors C1 and C2 sample the negative output of the op-amp and capacitors C3 and C4 sample the positive output of the op-amp. Flowing to block 340, the process moves to a second phase. Moving to block 350, the residue signal of the second phase is sampled. At block 360, capacitors C1 and C2 sample the positive output of the op-amp and capacitors C3 and C4 sample the negative output of the op-amp. The process then flows to an end block and returns to processing other actions.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. An apparatus for reducing and canceling 1/f noise, offset voltage, and charge injection introduced in pipeline ADCs using an op-amp sharing technique, comprising:
   an operational amplifier having a positive output and a negative output and configured to produce a residue signal having a first polarity during a first phase and a second polarity during a second phase;
   a first capacitor circuit coupled to one of the outputs during the first phase, and coupled to the other one of the outputs during the second phase; and
   a second capacitor circuit coupled to the other one of the outputs during the first phase and the one of the outputs during the second phase.

2. The apparatus of claim 1, wherein the first capacitor circuit, comprises a first capacitor and a second capacitor coupled to the one of the outputs during the first phase, and coupled to the other one of the outputs during the second phase.

3. The apparatus of claim 1, wherein the second capacitor circuit, comprises a third capacitor and a fourth capacitor coupled to the other one of the outputs during the first phase, and coupled to the one of the outputs during the second phase.

4. The apparatus of claim 1, further comprising a decision circuit coupled to the operational amplifier.

5. The apparatus of claim 4, wherein the decision circuit further comprises an input that is reversed between the first phase and the second phase.

6. The apparatus of claim 1, wherein the first capacitor circuit is coupled to the negative output of the operational amplifier during the first phase and coupled to the positive output during the second phase and wherein the second capacitor circuit is coupled to the positive output of the operational amplifier during the first phase and coupled to the negative output during the second phase.

7. A method for reducing and canceling 1/f noise, offset voltage, and charge injection introduced in pipeline ADCs using an op-amp sharing technique, comprising:
   moving to a first phase, and during the first phase:
      sampling a residue signal of a operational amplifier with a first polarity;
      a first capacitor circuit sampling a first output of the operational amplifier;
      a second capacitor circuit sampling a second output of the operational amplifier;

moving to a second phase, and during the second phase;
sampling the residue signal of an operational amplifier with a second polarity;
the first capacitor circuit sampling the second output of the operational amplifier; and
the second capacitor circuit sampling the first output of the operational amplifier.

8. The method of claim 7, wherein the first polarity is a positive polarity and the second polarity is a negative polarity.

9. The method of claim 7, wherein the first polarity is a negative polarity and the second polarity is a positive polarity.

10. The method of claim 7, wherein the first output is a positive output and the second output is a negative output.

11. The method of claim 7, wherein the first output is a negative output and the second output is a positive output.

12. The method of claim 7, wherein the first capacitor circuit further comprises at least two capacitors.

13. The method of claim 7, wherein the second capacitor circuit further comprises at least two capacitors.

14. An apparatus for reducing and canceling 1/f noise, offset voltage, and charge injection introduced in pipeline ADCs using an op-amp sharing technique, comprising:
means for moving to a first phase, and during the first phase:
means for sampling a residue signal of an operational amplifier with a first polarity;
means for a first capacitor circuit sampling a first output of the operational amplifier;
means for a second capacitor circuit sampling a second output of the operational amplifier;
means for moving to a second phase, and during the second phase;
means for sampling the residue signal of an operational amplifier with a second polarity;
means for the first capacitor circuit sampling the second output of the operational amplifier; and
means for the second capacitor circuit sampling the first output of the operational amplifier.

15. An apparatus for reducing and canceling 1/f noise, offset voltage, and charge injection introduced in pipeline ADCs using an op-amp sharing technique, comprising:
an operational amplifier having a positive output and a negative output and configured to produce a first residue signal;
a decision circuit coupled to the operational amplifier;
a first capacitor circuit coupled to one of the outputs during a first phase, and coupled to the other one of the outputs during a second phase; and
a second capacitor circuit coupled to the other one of the outputs during the first phase and the one of the outputs during the second phase.

16. The apparatus of claim 15, wherein the first capacitor circuit, comprises a first capacitor and a second capacitor coupled to the one of the outputs during the first phase, and coupled to the other one of the outputs dung the second phase.

17. The apparatus of claim 15, wherein the second capacitor circuit, comprises a third capacitor and a fourth capacitor coupled to the other one of the outputs during the first phase, and coupled to the one of the outputs during the second phase.

18. The apparatus of claim 15, wherein the decision circuit further comprises an input that is reversed between the first phase and the second phase.

19. An app for reducing and canceling 1/f noise, offset voltage, and charge injection introduced in pipeline ADCs using an op-amp sharing technique, comprising:
an operational amplifier having a positive output and a negative output and configured to produce a first residue signal;
a first capacitor circuit coupled to one of the outputs during a first phase, and coupled to the other one of the outputs during a second phase; and
a second capacitor circuit coupled to the other one of the outputs during the fist phase and the one of the outputs during the second phase; wherein the first capacitor circuit is coupled to the negative output of the operational amplifier during the first phase and coupled to the positive output during the second phase and wherein the second capacitor circuit is coupled to the positive output of the operational amplifier during the first phase and coupled to the negative output during the second phase.

20. The apparatus of claim 19, wherein the second capacitor circuit, comprises a third capacitor and a fourth capacitor coupled to the other one of the outputs during the first phase, and coupled to the one of the outputs during the second phase.

21. The apparatus of claim 19, further comprising a decision circuit coupled to the operational amplifier.

22. The apparatus of claim 21, wherein the decision circuit further comprises an input that is reversed between the first phase and the second phase.

* * * * *

UNITED STATES PATENT AND TRADEMARK OFFICE
CERTIFICATE OF CORRECTION

PATENT NO.         : 6,954,169 B1
APPLICATION NO. : 10/269931
DATED              : October 11, 2005
INVENTOR(S)       : Min It is certified that error appears in the above-identified patent and that said Letters Patent is hereby corrected as shown below:

Column 1, line 23, "Fliker" should read --Flicker--

Column 2, line 63, "Fliker" should read --Flicker--

Column 6, line 7, "dung" should read --during--

Column 6, line 18, "app" should read --apparatus--

Signed and Sealed this

Ninth Day of January, 2007

JON W. DUDAS
*Director of the United States Patent and Trademark Office*